ELECTRICAL COMPONENT MOUNTING PAD FOR PRINTED CIRCUIT BOARDS

Filed Dec. 26, 1962

INVENTOR
NATHANIEL R. VINCENT
BY [signature]
AGENT

United States Patent Office 3,184,536

Patented May 18, 1965

3,184,536

ELECTRICAL COMPONENT MOUNTING PAD FOR PRINTED CIRCUIT BOARDS

Nathaniel R. Vincent, Santa Monica, Calif., assignor to Douglas Aircraft Company, Inc., Santa Monica, Calif.

Filed Dec. 26, 1962, Ser. No. 246,893
4 Claims. (Cl. 174—138)

My invention relates generally to mounting pads and more particularly to a transistor mounting pad for use with printed circuit boards.

In present printed circuit boards, various electrical components and devices are mounted directly on the boards. These electrical components and devices include such items as resistors, capacitors, inductors, electronic tubes, diodes, transistors, etc. In certain of these items, especially the tubes, transistors, diodes and other semiconductor devices, there are usually two or more spaced or grouped leads which protrude or extend from a base or bottom surface of the device.

Since these items are thus constructed and, of course, intended for normal mounting to a surface in an upright position, or with the base generally parallel to the mounting surface of the printed circuit board, it has been common to design the printed circuit in a pattern such that a device can be mounted with its base substantially flush against the mounting surface of the board so that the base leads extend directly into holes of eyelets which are arranged in a pattern matching that of the lead pattern on the base of the device. It is apparent that with such an arrangement, the printed circuit pattern would have widely spaced elements in areas where the base leads of a device are comparatively widely separated as in an electronic tube or inductor, and elements of the pattern would be spaced more closely in areas where the base leads of a device are comparatively closely grouped as in a transistor or diode.

There are occasions when certain types of components such as transformers are spaced off the board, supported solely by the component leads. If necessary, these leads can be bent closer together and inserted into the holes in eyelets of a smaller circuit pattern on the board. These leads are then normally soldered to the eyelets with the device or component supported only no its own leads at some distance from the mounting surface of the printed circuit board. If the leads are too small and/or too long, the supported device or component can droop, causing some of the leads to short together or even contact other conducting elements of the board.

When the base lead pattern of the mounted device or component is very small, the printed circuit pattern would have closely spaced elements and/or very small (narrow) conducting strips, eyelets, etc. This, of course, increases the difficulty of construction and assembly of the printed circuit board. For example, soldering cannot be done as well with very small soldering eyelets, and the danger of shorts is increased for closely spaced printed circuitry.

The danger of damage to the extremely small circuitry of printed boards is very great when component replacement is necessary. A mounting pad which spreads the base leads of the very small components or devices permits the use of larger circuit patterns and thus decreases the danger in replacing small components. With the larger circuit patterns, larger manufacturing tolerances are permitted, which result in significant time and cost savings to a printed circuit board manufacturer.

Even where a device or component can be mounted on a printed circuit board with its base substantially flush with the mounting surface of the board, following soldering operation of the leads to the board eyelets, the soldering flux or rosin can collect between the base and mounting surface of the board and this collection cannot be adequately or completely cleansed away with solvents. Moisture can also collect between the base of the device or component and the mounting surface of the board. In addition, when the base is flush with the mounting surface, the heat produced during the soldering operation can be transmitted through the board and thus damage the flushly mounted device or component.

Bearing in mind the foregoing, it is a major object of my invention to provide a means for mounting an electrical component or device to the mounting surface of a printed circuit board whereby the leads extending from the base of an electrical component or device are suitably modified to permit direct insertion into corresponding holes in eyelets which are arranged in a printed circuit pattern of desired spacing and dimensions.

Another object of the invention is to provide means for mounting electrical components or devices having various sizes of base lead patterns, closely to the mounting surface of a printed circuit board without danger of shorting any of the base leads.

A further object of the invention is to provide a mounting pad for closely and solidly mounting an electrical component or deviec to a printed circuit board wherein the leads from such component or device can be soldered to printed circuit eyelets receiving the leads without allowing the heat produced from the soldering operation to injure the mounted component or device.

A still further object of this inveniton is to provide a mounting pad for closely mounting an electrical component or device to a printed circuit board and having a structure which permits proper cleaning of the mounting surface of the board, and simultaneously aids in isolating each of the base leads attached to the board.

Briefly, and in general terms, the foregoing and other objects are preferably accomplished by providing a mounting pad fabricated of electrical and heat insulating material, and having a disc or wafer structure including one or more passageways connecting a respective slot in a normally upper surface of the disc or wafer structure with a corresponding aperture in a normally lower surface, each passageway having an inner or outer side thereof sloping outwardly from the upper surface towards the lower surface or inwardly from the upper surface towards the lower surface, respectively, and each aperture in the lower surface is located closely adjacent the bight of an angularly bent mounting foot which normally rests on the mounting surface of a printed circuit board.

The passageways angularly modify the base leads from a mounted component or device so that the leads directly engage holes in corresponding circuit board eyelets, and the mounting feet provide firm, non-rocking support against the mounting surface of the printed circuit board. The mounting feet also permit proper cleansing by solvents of the mounting surface of a circuit board, of any solder flux accumulating under the mounting pad after the component or device leads have been soldered to the circuit board eyelets. At the same time, the mounting feet minimize the transmitted heat due to soldering and the pad additionally insulates the mounted component or device from the heat of soldering. The angularly bent feet further aid in guiding or orienting the angularly modified leads emerging from the mounting pad, and serve to separate and insulate the leads to some extent from each other and other closely adjacent circuits.

My invention will be more fully understood, and other objects and advantages thereof will become apparent from the detailed description given below of illustrative examples of the invention as taken in conjunction with the attached drawings, in which.

Figure 1:
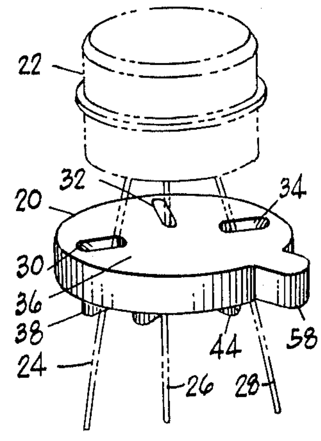
FIGURE 1 is a perspective view taken from the front of a mounting pad constructed according to my invention, illustrating its spreading action on the base leads of, for example, a transistor.

FIGURE 1 is a perspective view of the upper part of a mounting pad 20 fabricated according to my invention, illustrating its use with, for example, a transistor 22 having three leads 24, 26 and 28 which extend from the base or bottom surface of the transistor 22. As the leads 24, 26 and 28 are passed through passageways connecting respectively with slots 30, 32 and 34, the leads 24, 26 and 28 are spread apart as they emerge from the passageways as indicated. The bottom surface of the transistor 22 is substantially flush with the upper surface 36 of the mounting pad 20 when correctly mounted thereon.

The mounting pad 20 is preferably fabricated of strong and durable glass filled diallyl phthalate although other materials, such as nylon, can be used instead. The mounting pad 20 is not only useful for spreading the leads of, for example, a transistor 22, but also serves to insulate the transistor from the heat of soldering the leads 24, 26 and 28 to respective soldering eyelets of a printed circuit board to which the transistor 22 and pad 20 combination is installed.

Figure 2:
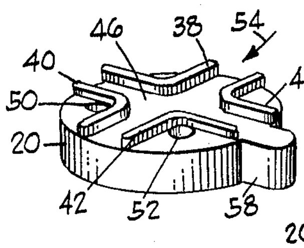
FIGURE 2 is a bottom perspective view of the mounting pad of FIGURE 1.

FIGURE 2 is a perspective view of the lower part of the mounting pad 20 showing mounting feet 38, 40, 42 and 44 extending a short distance from the lower surface 46 of the pad 20. The feet 38, 40 and 42 are bent about apertures 48 (not visible behind foot 38), 50 and 52 respectively, so that the bight of each foot is closely adjacent a corresponding aperture. The mounting feet 38, 40, 42 and 44 provide firm, non-rocking support against the upper surface of the printed circuit board to which is mounted the transistor 22 and pad 20. The mounting feet 38, 40, 42 and 44 permit cleansing of the surface area under the pad 20 and on the printed circuit board by means of solvent and also eliminates the danger of moisture traps at such locations.

The mounting foot 44 is provided on the lower surface 46 of the pad 20 in order to obtain uniform support for the pad 20. It is, of course, apparent that other and different configurations of mounting feet can be used to provide uniform support of the pad 20. However, by having curved feet wherein the bight of each is located closely adjacent the apertures 48, 50 and 52 in the lower surface 46 of the pad 20, the feet act to further guide and align the transistor leads emerging from the apertures 48, 50 and 52, and to separate and insulate the leads 24, 26 and 28 to some extent from each other and other circuits. For example, a conducting strip on the upper surface of the circuit board can run between the diametrical channel indicated by arrow 54 and which is generally at right angles to the diametrical channel running in the direction of tab 58.

Figure 3:
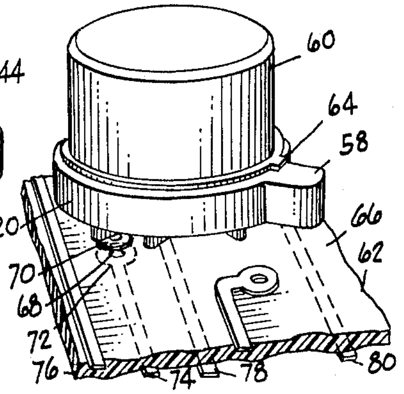
FIGURE 3 is a perspective view showing the pad of FIGURE 1 mounting a transistor, and installed on a printed circuit board.

FIGURE 3 is a perspective view showing the pad 20 mounting a transistor 60 and installed on a printed circuit board 62. The transistor 60 in this instance has a small reference or index tab 64 which is aligned with the tab 58 on the mounting pad 20. Since a small reference tab mark is normally provided on the upper surface 66 of the circuit board 62, the tab 58 on the mounting pad 20 aligned with the small tab 64 on the transistor 60 permits rapid and positive assembly to the board 62. This, of course, presumes that the transistor 60 or other such element to be mounted on the pad 20, has an appropriate lead arrangement and reference tab position that can be properly used with the arrangement and configuration of the pad 20.

The mounting pad 20 separates and spreads the leads from the transistor 60 so that these leads, as straightened and aligned by the bights of the feet 38, 40 and 42, can be easily and directly inserted into holes, such as the lead 68 into the hole 70, in the upper surface 66 of the printed circuit board 62. The leads pass through the board 62 and are soldered to eyelets such as the eyelet 72 of the conducting strip 74 on the lower surface 76 of the board 62. Other conducting strips 78 and 80 on the lower surface of the board 62 connect with eyelets which are soldered to respective leads of the transistor 60. Excess lengths of lead can be cut after soldering.

The holes through the eyelets in the board 62 are large enough to easily pass the transistor leads. This, however, permits solder flux or rosin to flow through the holes around the leads and collect at the upper surface of the board 62 about the leads. The mounting feet 38, 40 and 42 prevent the molten rosin from spreading too far, and permits the use of solvent to reach and dissolve the collected rosin. Other matter such as dust, dirt, grease, etc. can also be removed by the cleansing action of the solvent. The transistor 60 is also spaced away from the soldering point by the pad 20 and is thus simultaneously insulated by it (a heat insulator).

Figure 4:
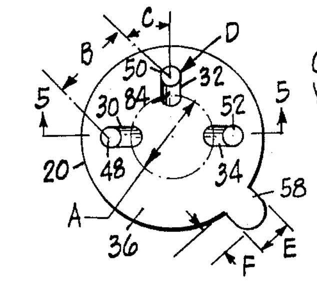
FIGURE 4 is a top plan view of the mounting pad of FIGURE 1.

FIGURE 4 is a top plan view of the mounting pad 20. The pad 20 is a generally circular disc having a protruding peripheral tab 58. The central longitudinal axes of the slots 30 and 34 in the surface 36 of the pad 20 are aligned on a disc diameter which is perpendicular to another disc diameter on which the central longitudinal axis of the slot 32 is aligned. The slots 30, 32 and 34 are connected by respective passageways to the apertures 48, 50 and 52 in the lower surface of the pad 20. The apertures 48, 50 and 52 can be essentially circular as illustrated.

The slots 30, 32 and 34 are each rounded at both ends on full radii, the inner semicircular ends of the slots having centers located on a circle of diameter A. The centers of the outer semicircular ends of the slots 30 and 32 are separated by a distance B as measured at right angles between lines making an angle C with the central longitudinal axis of the slot 32. The distance between centers of the outer semicircular ends of the slots 32 and 34 is the same distance B when measured between lines through such centers and making a similar angle C with the longitudinal axis of the slot 32. The slots 30, 32 and 34 each have inner and outer semicircular ends of diameter D, and the tab 58 has a width E and length F which is measured between a line tangent to the extreme (pad) radial tip of the semicircular end of the tab 58 and a parallel line intersecting the corners formed by the sides of the tab 58 meeting the circular periphery of the pad 20.

Figure 5:
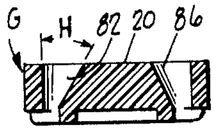
FIGURE 5 is a sectional view of the pad as taken in the direction of the line 5—5 indicated in FIGURE 4.

FIGURE 5 is a sectional view of the pad 20 taken along the line 5—5 as indicated in FIGURE 4. Passageways 82, 84 (FIGURE 4) and 86 respectively connect the slots 30, 32 and 34 to the apertures 48, 50 and 52. The outer semicircular ends of the slots are connected vertically to corresponding outer, semicircular halves of the respective circular apertures. However, the inner semicircular ends of the slots must slope outwardly to join with their corresponding inner, semicircular halves of the respective circular apertures. The inner sloping side of each passageway makes an angle H with the outer vertical side thereof. The usual draft angle G is provided on the sides of the pad 20.

It can be seen that the inner semicircular ends of the slots 30, 32 and 34 should preferably be closely aligned with the respective leads from the transistor to be mounted, and that the angle H should not exceed an angle of, for example, approximately 30 degrees with the usual transistor leads, otherwise the transistor glass to metal seal around the leads or the leads themselves might be cracked or broken. The transistor lead arrangement or pattern need not exactly match the pattern of the inner semicircular ends of the slots 30, 32 and 34 because the leads can be bent to some extent. However, for a good fit, the transistor lead pattern should be similar to that of the inner semicircular ends of the slots 30, 32 and 34. Of course, the centers of the transistor leads should also lie on a circle of at least diameter A but not beyond the longitudinal radial length of the slots 30, 32 and 34.

Figure 6:
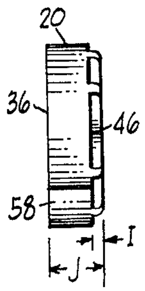
FIGURE 6 is a side elevational view of the pad of FIGURE 1.

FIGURE 6 is a side elevational view of the mounting pad 20. As indicated, the pad 20 has a height or overall thickness J and mounting feet of height I extending beyond the lower surface 46 of the mounting pad 20. The thickness of the pad 20 between the normally upper surface 36 and the normally lower surface 46 is thus $J-I$. For a given thickness $J-I$, it can be seen from FIGURE 5 that the transistor leads are spread radially a distance proportional to the size of the angle H.

If the thickness $J-I$ is varied, then the amount of spread of each lead radially from its original position is equal to $(J-I) \tan H$. This, of course, assumes that the bottom surface of the mounted transistor is flush with the upper surface 36 of the mounting pad 20, and the transistor lead arrangement or pattern matches the pattern of the inner semicircular ends of the slots 30, 32 and 34 of the pad 20.

Figure 7:
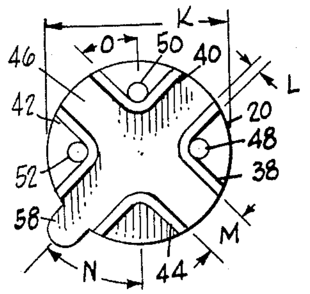
FIGURE 7 is a bottom plan view of the pad of FIGURE 1.

FIGURE 7 is a bottom plan view of the mounting pad 20. The apertures 48, 50 and 52 in the lower surface 46 of the pad 20 are located closely adjacent to the bights of the mounting feet 38, 40 and 42, respectively. By bending the fully spread transistor leads after passing through the passageways 82, 84 and 86 against the bight sides, the leads are automatically straightened and aligned for insertion into the corresponding hole pattern in the upper surface 66 of the printed circuit board 62. This is a clear advantage of having curved feet with their respective bights located closely adjacent to the emergent apertures in the lower surface of a mounting pad.

The mounting pad 20 has a diameter K and the corners or centers of the bights of feet 40 and 44 are located on a common pad diameter which is perpendicular to another diameter on which the corners or centers of the bights of feet 38 and 42 are aligned. The feet 38, 40, 42 and 44 are bent typically at an angle O with respect to these pad diameters as indicated in FIGURE 7. The thickness of the feet 38, 40, 42 and 44 is preferably the same, and is of a typical thickness L. The feet form two channels which are at right angles to each other and each has a channel spacing M. The tab 58 is located on a pad diameter oriented at an angle N from the vertical diameter through the centers of the bights of feet 40 and 44.

Figure 8:
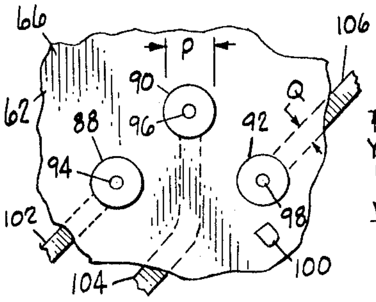
FIGURE 8 is a fragmentary top plan view of a printed circuit board showing board eyelets arranged in a pattern for mounting a transistor.

FIGURE 8 is a fragmentary top plan view of the printed circuit board 62, showing a typical printed circuit pattern. Three eyelets, 88, 90 and 92 are provided in the board 62 and having respective holes 94, 96 and 98 for receiving the leads emerging from apertures 48, 50 and 52, for example, of the pad 20. A printed mark 100 is also provided on the upper surface 66 of the board 62 for alignment of tab 58 of pad 20 and thus facilitating and ensuring proper installation of the pad 20 and its mounted transistor.

The holes 94, 96 and 98 in board 62 are arranged in a pattern which matches that of the apertures 48, 50 and 52 in the lower surface 46 of the pad 20. The eyelets 88, 90 and 92 connect respectively with conducting strips 102, 104 and 106 on the lower suface 76 (FIGURE 3) of the board 62. The spreading of the leads of, for example, a transistor permits the use of larger eyelets to which the leads can be more easily soldered. Each of the eyelets 88, 90 and 92 has a diameter P, and each of the conducting strips 102, 104 and 106 has a width Q, as indicated.

Figure 9:
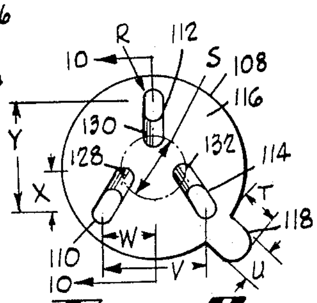
FIGURE 9 is a top plan view of another version of a mounting pad.

FIGURE 9 shows the top plan view of another version of a mounting pad 108 fabricated in accordance with my invention. The slots 110, 112 and 114 in the upper surface 116 of the pad 108 have semicircular ends of diameter R, and the centers of the inner ends are located on a circle of diameter S. The longitudinal axis of slot 112 is aligned with a vertical (with respect to FIGURE 9) pad diameter, and the centers of the inner semicircular ends of the slots 110 and 114 are aligned on another pad diameter which is perpendicular to the vertical diameter.

The pad 108 also preferably has a reference or index tab 118 having a length T which is measured between a line tangent to the extreme radial tip of the semicircular end of the tab 118, and a parallel line intersecting the corners formed by the sides of the tab 118 meeting the circular periphery of the pad 108. The tab 118 has a width U as indicated.

The centers of the outer semicircular ends of the slots 110 and 114 are each separated by a distance W perpendicularly from the pad diameter coinciding with the central longitudinal axis of the slot 112. The distance V between the centers of the outer semicircular ends of the slots 110 and 114 is thus equal to 2W. The centers of the outer semicircular ends of the slots 110 and 114 are both located a vertical distance X from the horizontal (with respect to FIGURE 9) diameter passing through the center of pad 108 and the centers of the inner semicircular ends of the slots 110 and 114. The centers of the outer semicircular ends of the slots 110 and 114 are both located a vertical distance Y from the center of the outer semicircular end of the slot 112.

Figure 10:
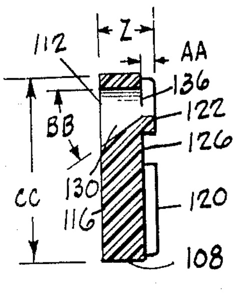
FIGURE 10 is a sectional view of the pad as taken along the line 10—10 indicated in FIGURE 9.

FIGURE 10 is a sectional view of the mounting pad 108 taken along the line 10—10 as indicated in FIGURE 9. The pad 108 has a height or overall thickness Z which includes the height of feet 120, 122 and 124 (not visible in FIGURE 10) extending a distance AA from the normally lower surface 126 of the pad 108. The distance between the normally upper surface 126 is thus $Z-AA$.

The slots 110, 112 and 114 have outer semicircular ends which extend vertically through passageways 128, 130 and 132 (FIGURE 9) to join with the corresponding outer semicircular ends of slots 134, 136 and 138 (FIGURE 12) in the normally lower surface 126 of the pad 108. The passageways 128, 130 and 132 slope outwardly from the inner semicircular ends of the slots 110, 112 and 114 to connect with the corresponding inner semicircular ends of the slots 134, 136 and 138 in the normally lower surface 126. The passageway 130 is shown in FIGURE 10 and the outwardly sloping side of the passageway makes an angle BB with the vertical (shown horizontally in FIGURE 10) side thereof.

As in the previous version of my invention, the angle BB should not exceed approximately 30 degrees, and the outward spreading of a lead from its original position is equal to $(Z-AA) \tan BB$. As before, this assumes that the bottom surface of a transistor having its leads spread, is nearly flush with or closely adjacent to the normally upper surface 116 of the pad 108. The lead pattern of the transistor, of course, should be similar to that of the inner semicircular ends of the slots 110, 112 and 114. The pad 108 has a circular peripheral diameter CC.

Figure 11:
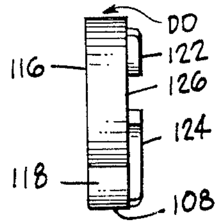
FIGURE 11 is a side elevational view of the pad of FIGURE 9.

FIGURE 11 is a side elevational view of the mounting pad 108. The pad 108 has the usual draft angle DD on the sides, the angle sloping slightly inwardly from the normally upper surface 116 to the normally lower surface 126. This is similar to that for the previous version mounting pad 20. The draft angle is, of course, provided strictly according to conventional practice and is indicated primarily for completeness of disclosure.

Leads passed through either of the pads 20 or 108 are spread a greater amount for increasing angles H or BB (FIGURES 5 and 10). For such increasing angles, a lead emerging from the apertures in the normally lower surface 46 or 126 intersects with the plane of these surfaces in an increasingly longer ellipse. Thus, the substantially circular apertures 48, 50 and 52 of pad 20 can evolve into slots such as the slots 134, 136 and 138 of pad 108 where the angle BB is greater and there is not much room on the pad 108 for greatly over-sized circular holes.

Figure 12:
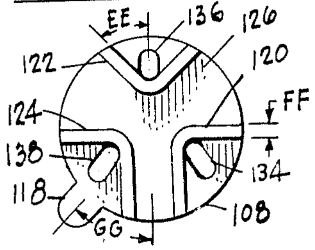
FIGURE 12 is a bottom plan view of the pad of FIGURE 9.

FIGURE 12 is a bottom plan view of the mounting pad 108 clearly showing the shape and arrangement of the feet 120, 122 and 124. As can be seen, the inner semicircular ends of the slots 134, 136 and 138 are located closely adjacent to the corners or bights of the feet 120, 122 and 124, respectively. The central longitudinal axis of the slot 136 is aligned with a vertical (with respect to FIGURE 12) diameter of the pad 108, and the sides of the foot 122 make an angle EE with this vertical diameter. This angle EE, of course, applies symmetrically to both of the sides of the foot 122.

The thickness FF of the foot 120 indicated in FIGURE 12 is preferably that for feet 122 and 124, too. The feet 122 and 124 each has a side which extends parallel to the vertical diameter coinciding with the central longitudinal axis of the slot 136, and each has another side which runs at right angles to the vertical diameter. The central axis of the tab 118 coincides with a pad radius which makes an angle GG with the vertical diameter coinciding with the central longitudinal axis of the slot 136.

Vertical with respect to FIGURE 12 is, of course, to be distinguished from the vertical with respect to the pad 108, which is perpendicular to the plane of the paper in this figure. It is also to be noted that the slots 110 and 114 in the upper pad surface 116 are longer than the slot 112. Similarly, the slots 134 and 138 in the lower pad surface 126 are longer than the slot 136.

Figure 13:
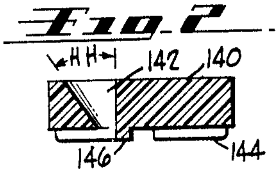
FIGURE 13 is a sectional view of yet another version of a mounting pad, this view being similar to that of FIGURE 10.

FIGURE 13 is a central sectional view of a mounting pad 140, the view being similar to that of FIGURE 10 and the pad 140 being generally similar to the pad 108. The angle HH of pad 140 corresponds to the angle BB of pad 108. However, it is immediately apparent that the outer side of the passageway 142 slopes inwardly from upper to lower surfaces and the inner side is substantially vertical, whereas the outer side of passageway 130 is substantially vertical from normally upper to lower surfaces and the inner side slopes outwardly.

The other two passageways of pad 140 are, of course, normally similar to passageway 142. The pad 140 is thus used to normally draw together the widely spread leads of, for example, a larger transistor or one in which it is desired to match the smaller pattern of standard printed circuit boards. It is possible that the passageways of pad 140 include combinations of passageways which are similar to both passageway 142 and passageway 130 of pad 108. The feet 144 and 146 of pad 140 correspond to feet 120 and 122, respectively, of pad 108 and can be similar thereto in shape and arrangement.

As mentioned previously, the mounting pads are preferably fabricated of thermosetting, glass filled diallyl phthalate but other materials can obviously be used. The mounting pad 20 when used with a transistor having a T05 casing and lead pattern or arrangement, the printed circuit board elements used therewith, and the mounting pad 108 when used with a transistor having a T018 casing and lead pattern arrangement, can have the following example dimensions.

*Mounting pad 20*

| | | |
|---|---|---|
| A | inch | .200 |
| B | do | .200 |
| C | degrees | 45 |
| D | inch | .040 |
| E | do | 1/16 |
| F | do | 1/16 |
| G | degree | 1/2 |
| H | degrees | 24 |
| I | inch | .031 |
| J | do | .125 |
| K | do | .388 |
| L | do | .031 |
| M | do | .098 |
| N | degrees | 45 |
| O | do | 45 |

*Printed circuit board 62*

| | | |
|---|---|---|
| P | inch | .125 |
| Q | do | .050 |

*Mounting pad 108*

| | | |
|---|---|---|
| R | inch | .040 |
| S | do | .100 |
| T | do | 1/16 |
| U | do | 1/16 |
| V | do | .200 |
| W | do | .100 |
| X | do | .075 |
| Y | do | .200 |
| Z | do | .125 |
| AA | do | .031 |
| BB | degrees | 30 |
| CC | inch | 11/32 |
| DD | degree | 1/2 |
| EE | degrees | 45 |
| FF | inch | .031 |
| GG | degrees | 45 |

The foregoing values are, of course, illustrative and should not be construed as limiting on my invention in any manner. It should also be apparent that the particular versions or embodiments of the invention described above and shown in the drawings are exemplary of and not restrictive on my broad invention, and that various changes in design, structure and arrangement may be made in the invention without departing from the legitimate and valid scope of the appended claims.

I claim:

1. A mounting pad for use with printed circuit boards and the like, comprising:
- a wafer structure having a normally upper surface and a normally lower surface, and including
  - at least two openings in said upper surface arranged in a predetermined pattern, one of said openings being a slot having an end generally located on a central, radially inner circle and another end generally located on a central, radially outer circle,
  - at least two corresponding apertures in said lower surface arranged in a pattern generally corresponding to the predetermined pattern in said upper surface, the aperture associated with said slot having one end generally located on a central circle disposed radially intermediate the circles on which the inner end and the outer end of said slot are respectively located and another end generally located on another circle disposed radially similar to one of the circles on which the inner and outer ends of said slot are respectively located, and
  - at least two passageways through said wafer structure respectively connecting said openings and said corresponding apertures, said passageway connecting said slot and corresponding aperture having an inner side joining the inner end of said slot to the inner end of said corresponding aperture and an outer side joining the outer end of said slot to the outer end of said corresponding aperture, one of said inner and outer sides being generally vertical and the other side sloping generally in a radical direction from said upper surface toward said lower surface at a predetermined angle relative to the vertical; and a plurality of circumferentially spaced mounting feet extending as separate longitudinally curved ridges from said lower surface, at least two of said feet being curved with bights located closely adjacent to a part of respective peripheries of said apertures, whereby an electrical lead passed through said passageway connecting said slot and corresponding aperture is guided by said sloping side and can be laterally displaced a predetermined maximum distance by said passageway, and said mounting feet provide firm and non-rocking support of said pad against the mounting surface of a printed circuit board, and aid in aligning and insulating the electrical leads emerging from said apertures.

2. A mounting pad for use with printed circuit boards and the like, comprising:

a wafer structure having a normally upper surface and a normally lower surface, and including at least two slots in said upper surface arranged in a predetermined pattern, said slots having one set of corresponding ends generally located on a central, radially inner circle of a significant diameter and another set of corresponding ends generally located on a central, radially outer circle, at least two corresponding apertures in said lower surface arranged in a pattern corresponding to the predetermined pattern in said upper surface, said apertures having one set of corresponding ends generally located on a central circle disposed radially intermediate the circles on which the inner ends and the outer ends of said slots are respectively located and another set of corresponding ends generally located on another circle disposed radially similar to one of the circles on which the sets of inner and outer ends of said slots are respectively located, and at least two passageways through said wafer structure respectively connecting said slots and said corresponding apertures, said passageways having an inner set of sides respectively joining the inner ends of said slots to the inner ends of said corresponding apertures and an outer set of sides respectively joining the outer ends of said slots to the outer ends of said corresponding apertures, one of the sets of said inner and outer sides being generally vertical and the other set of sides sloping generally in a radical direction from said upper surface toward said lower surface at a predetermined angle relative to the vertical; and at least two circumferentially spaced mounting feet extending as longitudinally curved ridges from said lower surface, whereby electrical leads passed through said pad are guided by said sloping sides and can be each laterally displaced a predetermined maximum distance by said passageways, and said mounting feet provide firm and non-rocking support of said pad against the mounting surface of a printed circuit board.

3. A mounting pad for use with printed circuit boards and the like, comprising:

a wafer structure of thickness $t$ having a normally upper, flat surface and a normally lower, flat surface, and including at least three slots in said upper surface arranged in a predetermined pattern, said slots having one set of corresponding semicircular ends generally located on a central, radially inner circle and another set of corresponding semicircular ends generally located on a central, radially outer circle, at least three corresponding apertures in said lower surface arranged in a pattern corresponding to the predetermined pattern in said upper surface, said apertures having one set of corresponding semicircular ends generally located on a central circle disposed radially intermediate the circles on which the inner ends and the outer ends of said slots are respectively located and another set of corresponding semicircular ends generally located on another circle disposed radially similar to the circle on which the outer ends of said slots are located, and at least three passageways through said wafer structure respectively connecting said slots and said corresponding apertures, said passageways having inner, semicircularly concave sides respectively joining the inner ends of said slots to the inner ends of said corresponding apertures and outer, semicircularly concave sides respectively joining the outer ends of said slots to the outer ends of said corresponding apertures, said outer sides being generally vertical and said inner sides sloping generally radially outwardly from said upper surface toward said lower surface at an angle B relative to the vertical; and at least three circumferentially spaced mounting feet extending as separate longitudinally curved ridges from said lower surface, said feet being right angularly curved with bights of said feet located closely adjacent to a radially inner part of respective peripheries of said apertures, whereby electrical leads passed through said pad are received in and guided by said inner, semicircularly concave sides and can be each laterally displaced a maximum distance of $t \tan B$ by said passageways, and said mounting feet provide firm and non-rocking support of said pad against the mounting surface of a printed circuit board, and aid in aligning and insulating the electrical leads emerging from said apertures.

4. A mounting pad for use with printed circuit boards and the like, comprising:

a wafer structure of thickness $t$ having a normally upper, flat surface and a normally lower, flat surface, and including at least three slots in said upper surface arranged in a predetermined pattern, said slots having one set of corresponding semicircular ends generally located on a central, radially inner circle and another set of corresponding semicircular ends generally located on a central, radially outer circle, at least three corresponding apertures in said lower surface arranged in a pattern corresponding to the predetermined pattern in said upper surface, said apertures having one set of corresponding semicircular ends generally located on a central circle disposed radially intermediate the circles on which the inner ends and the outer ends of said slots are respectively located and another set of corresponding semicircular ends generally located on another circle disposed radially similar to the circle on which the outer ends of said slots are located, and at least three passageways through said wafer structure respectively connecting said slots and said corresponding apertures, said passageways having inner, semicircularly concave sides respectively joining the inner ends of said slots to the inner ends of said corresponding apertures and outer, semicircularly concave sides respectively joining the outer ends of said slots to the outer ends of said corresponding apertures, said outer sides being generally vertical and said inner sides sloping generally radially outwardly from said upper surface toward said lower surface at an angle B relative to the vertical; and at least four equiangularly spaced mounting feet extending as separate longitudinally curved ridges from said lower surface, said feet being right angularly curved with bights of at least three of said feet located closely adjacent to a radially inner part of respective peripheries of said apertures, whereby electrical leads passed through said pad are received in and guided by said inner, semicircularly concave sides and can be each laterally displaced a maximum distance of $t$ tan $B$ by said passageways, and said mounting feet provide firm and non-rocking support of said pad against the mounting surface of a printed circuit board, and aid in aligning and insulating the electrical leads emerging from said apertures.

References Cited by the Examiner

UNITED STATES PATENTS

| | | | |
|---|---|---|---|
| 878,302 | 2/08 | Markel | 174—157 |
| 2,453,826 | 11/48 | Adams | 339—193 |
| 2,483,351 | 9/49 | Richardson | 339—99 X |
| 2,999,895 | 9/61 | Smith | 174—138 |
| 3,107,963 | 10/63 | Hansen | 339—65 X |

FOREIGN PATENTS

| | | |
|---|---|---|
| 873,802 | 7/61 | Great Britain. |

OTHER REFERENCES

The Milton Ross Company, "Firm Footing for Transistors," Electronics, vol. 34, No. 6, Feb. 10, 1961, page 33.

Assmann (German Printed Application), 1,070,707, Dec. 10, 1959.

JOHN F. BURNS, *Primary Examiner.*

JOHN P. WILDMAN, LARAMIE E. ASKIN, E. JAMES SAX, *Examiners.*